United States Patent
Cagnoni et al.

(10) Patent No.: US 6,944,021 B2
(45) Date of Patent: Sep. 13, 2005

(54) VENTILATION SYSTEM FOR ELECTRICAL WIRING ARRANGEMENTS OF ELECTRICAL CIRCUITS

(75) Inventors: Michele Cagnoni, Piossasco (IT); Piero Carbonaro, Turin (IT); Giuseppe Caudera, Cirie' (IT)

(73) Assignee: Magneti Marelli Powertrain S.p.A., Corbetta (IT)

( * ) Notice: Subject to any disclaimer, the term of this patent is extended or adjusted under 35 U.S.C. 154(b) by 0 days.

(21) Appl. No.: 10/708,747

(22) Filed: Mar. 23, 2004

(65) Prior Publication Data

US 2005/0002164 A1 Jan. 6, 2005

(30) Foreign Application Priority Data

Mar. 25, 2003 (IT) ..................................... TO2003A0223

(51) Int. Cl.⁷ ................................................. H05K 7/20
(52) U.S. Cl. ...................... 361/690; 361/722; 439/485; 439/519; 174/16.1; 174/17 VA
(58) Field of Search ................................ 361/688–690, 361/695, 719–723; 174/16.1, 17 VA, 252; 165/80.3, 104.33; 439/485, 486

(56) References Cited

U.S. PATENT DOCUMENTS

| 5,668,349 | A | | 9/1997 | Durham et al. ......... 174/17 VA |
|---|---|---|---|---|
| 6,028,770 | A | * | 2/2000 | Kerner et al. ................ 361/704 |
| 6,222,119 | B1 | | 4/2001 | Turunen .................... 174/35 R |
| 6,614,659 | B2 | * | 9/2003 | Feigenbaum et al. ........ 361/719 |
| 6,776,641 | B2 | * | 8/2004 | Hachuda ...................... 439/331 |
| 2002/0197895 | A1 | * | 12/2002 | Eldridge ..................... 439/132 |

FOREIGN PATENT DOCUMENTS

| DE | 42 10 979 A1 | 10/1993 | ............ H05K/7/20 |
|---|---|---|---|
| EP | 1 168 903 A | 1/2002 | ............ H05K/5/02 |
| EP | 1 227 006 A1 | 7/2002 | ............ B60R/16/02 |

OTHER PUBLICATIONS

European Search Report for EP 04 10 1160 (Jul. 26, 2004).

* cited by examiner

*Primary Examiner*—Boris Chervinsky
(74) *Attorney, Agent, or Firm*—Howrey LLP

(57) ABSTRACT

A ventilation system is described for electrical wiring arrangements of electrical circuits comprising a plurality of electrical connection terminals arranged within an insulating element; the ventilation system comprising a plurality of electrical ventilation cables connected to the respective electrical terminals of the electrical circuit; a plurality of connection chambers each produced in the body of the insulating element in such a manner as to accommodate therein the connection between the electrical ventilation cable and the corresponding terminal while maintaining the connection insulated from the outside; and at least one communication duct between the connection chambers produced in the body of the insulating element and designed so as to permit the passage of air between the connection chambers and through the electrical ventilation cables.

7 Claims, 3 Drawing Sheets

US 6,944,021 B2

VENTILATION SYSTEM FOR ELECTRICAL WIRING ARRANGEMENTS OF ELECTRICAL CIRCUITS

CROSS REFERENCE TO RELATED APPLICATIONS

The present application claims priority to Italian Patent Application Serial No. TO2003A 000223 filed Mar. 25, 2003.

BACKGROUND OF INVENTION

1. Field of the Invention

The present invention relates to a ventilation system for electrical wiring arrangements of electrical circuits.

In particular, the present invention relates to a ventilation system for electrical wiring arrangements of electrical circuits present in devices, apparatuses and/or sensors that can be installed in a motor vehicle, to which the following explanations will make explicit reference, without thereby restricting the general scope thereof.

2. Description of Related Art

As is known, some types of control devices, in particular some types of sensors typically used in motor vehicles, are provided with one or more electrical terminals for connecting the electrical circuit of the sensor and with an inner chamber hermetically closed relative to the outside environment, i.e. tightly sealed, said cavity being capable of accommodating therein one or more electrical wiring arrangements between the electrical terminals of the sensor and the associated electrical connection cables, which are capable of connecting said sensor to corresponding electronic devices installed in the vehicle, such as for example the central sensor control unit and/or the remote central electronic unit.

It is furthermore known that when said sensors are installed in the vehicle close to a heat source, the air present within the inner chamber is subject to considerable fluctuations in temperature, which bring about great expansions and contractions of volume within said inner chamber, so causing an "air pumping" effect, which promotes the formation of moisture in said inner chamber, with all the associated disadvantages.

With the aim of avoiding said disadvantages, a terminal of the above-mentioned sensors is normally connected to the remote central electronic unit by means of an electrical cable, hereinafter denoted "electrical ventilation cable", which is capable both of effecting electrical connection of the sensor to the remote central electronic unit and of bringing the inner chamber of the sensor, and thus the associated electrical wiring arrangement, in direct communication with an environment under atmospheric pressure. In the present case, the electrical ventilation cable is made in such a manner as to permit a stream of air to pass between the two ends, a first end of which is wired to the electrical terminal present in the inner chamber of the sensor, while the second end is wired to the electrical terminal present within a chamber of the remote central electronic unit, which is typically in communication, via a valve, with the outside environment and is thus at atmospheric pressure.

Unfortunately, ventilating the inner chamber of the sensor is not feasible when the second end of the electrical ventilation cable is connected to a terminal (of any device) accommodated within a chamber that is hermetically sealed relative to the outside environment or to a terminal that is completely embedded in an insulating material. Such a situation arises, for example, when the wiring arrangement is produced between the sensor and central sensor control unit, the terminals of which are themselves completely embedded in an insulating material; in this case, the air present in the inner chamber of the sensor is not capable of expanding freely through the electrical ventilation cable, so giving rise to the same disadvantages described above, namely the possible formation of moisture in the inner chamber of the sensor.

SUMMARY OF INVENTION

The object of the present invention is to produce a ventilation system for electrical wiring arrangements of electrical circuits which is capable of overcoming the above-described disadvantages.

According to the present invention a ventilation system is produced for electrical wiring arrangements of electrical circuits comprising a plurality of electrical connection terminals arranged within an insulating element; said ventilation system being characterized in that it comprises a plurality of electrical ventilation cables connected respectively to said electrical terminals of said electrical circuit, a plurality of connection chambers each produced in the body of said insulating element in such a manner as to accommodate therein said connection between said electrical ventilation cable and said terminal while maintaining said connection insulated from the outside; and at least one communication duct between said connection chambers produced in said insulating element and designed so as to permit the passage of air between said connection chambers and through said ventilation cables.

BRIEF DESCRIPTION OF DRAWINGS

The following figures form part of the present specification and are included to further demonstrate certain aspects of the present invention. The invention may be better understood by reference to one or more of these figures in combination with the detailed description of specific embodiments presented herein.

DETAILED DESCRIPTION

Figure 1:
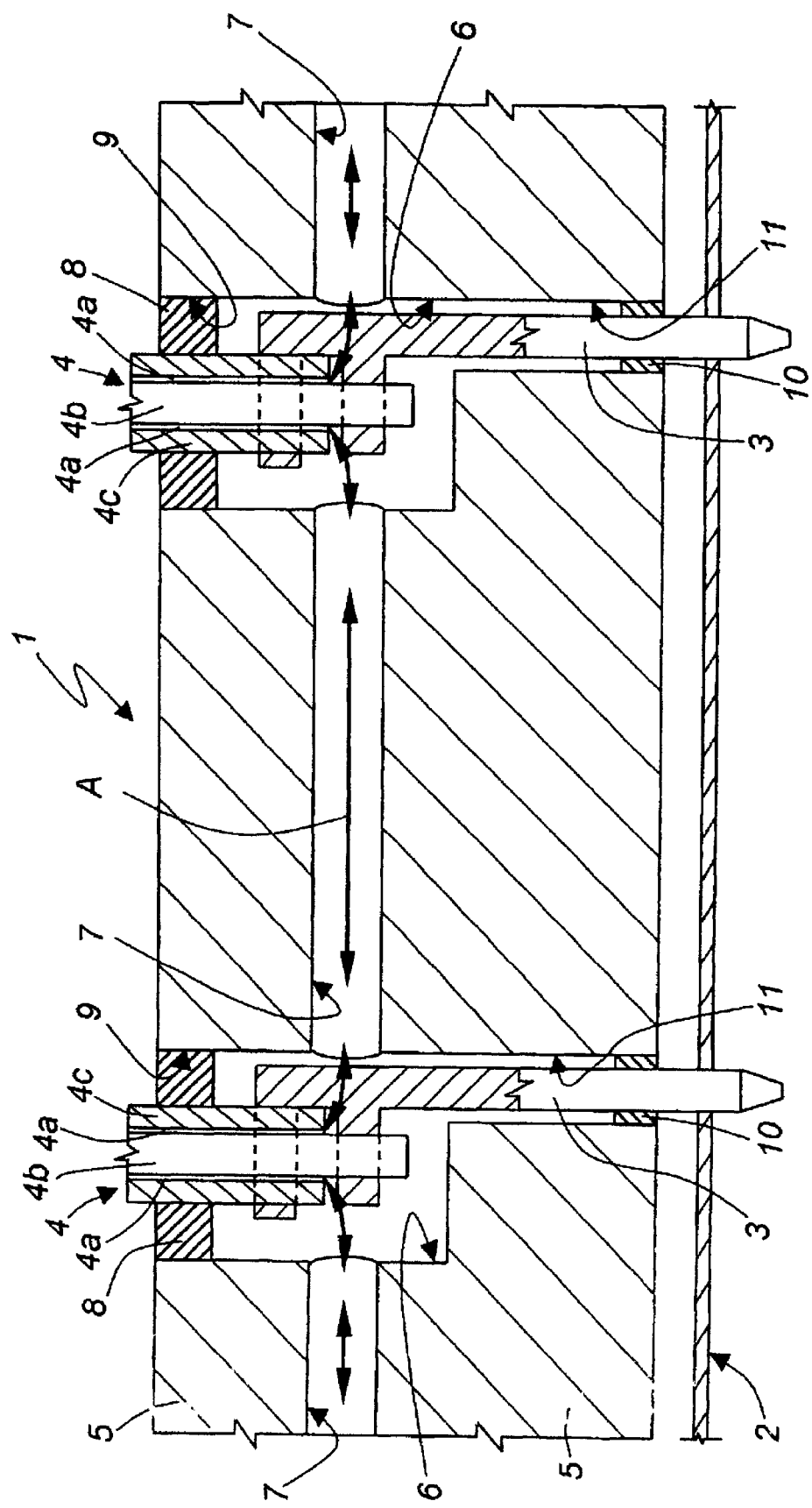
FIG. 1 is a schematic illustration of a cross-section through a first type of electrical wiring arrangement provided by the ventilation system for wiring arrangements of electrical circuits, produced as defined by the present invention.
Figure 2:
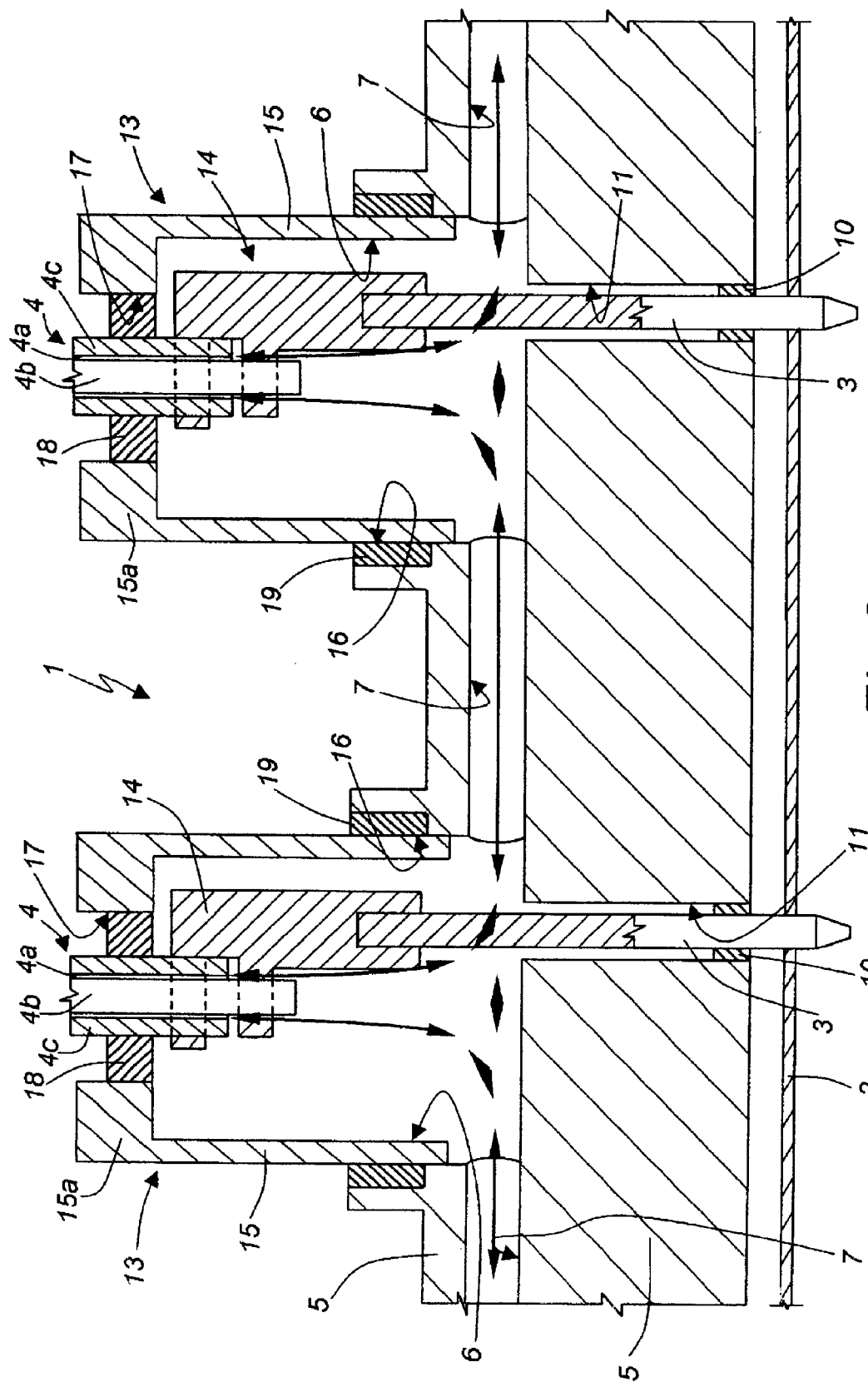
FIG. 2 is a schematic illustration of a cross-section through a second type of electrical wiring arrangement provided by the ventilation system for wiring arrangements of electrical circuits, produced as defined by the present invention.

With reference to FIGS. 1 and 2, the number 1 denotes the overall ventilation system for electrical wiring arrangements of an electrical circuit 2, provided with a plurality of terminals 3, each one of which is capable of being electrically connected to a respective electrical ventilation cable 4 (one end of which is illustrated in part).

Each electrical ventilation cable 4 is made in such a manner as to have a series of longitudinal air spaces or microducts 4a produced in the conductive core 4b of the cable and/or between the conductive core and the outer portion or insulating sheath 4c. Each micro-duct 4a is designed in such a manner as to permit a stream of air to flow within it along a path passing through the electrical ventilation cable 4.

In the examples shown in FIGS. 1 and 2, the electrical circuit 2 is defined by a printed electrical circuit provided with a series of conductive tracks (not shown) and with a series of terminals 3 (two of which are shown in FIGS. 1 and 2), each of which extends through an insulating element 5 made from a non-conductive material and extending above and opposite the printed electrical circuit 2. In the present case, the insulating element 5 can be defined by the rigid portion of insulating material, for example the insulating portion of the connector of the electrical circuit 2.

With reference to FIG. 1, there are produced in the body of the element of insulating material 5 a series of connection chambers 6, each of which is designed in such a manner as to accommodate within it the wiring arrangement or electrical connection between an electrical ventilation cable 4 and a terminal of the electrical circuit 2. At least one tubular duct 7 is also produced in the body of the element of insulating material 5, which duct has the function of bringing the connection chambers 6 into mutual communication in order to allow air to pass between them. In the present case, each tubular duct 7 extends through the insulating element 5 between the connection chambers 6 in such a manner as to bring the various electrical ventilation cables 4 into mutual communication, so allowing the air present inside the connection chambers 6 to circulate and expand freely from and towards the various electrical ventilation cables 4.

In other words, each tubular duct 7 connecting two connection chambers 6 also brings the two electrical ventilation cables 4 coupled to the connection chambers 6 into communication, so allowing air to circulate along a path indicated by the letter A (FIG. 1), which passes through a first electrical ventilation cable 4 and the respective connection chamber 6, the tubular duct 7, a second electrical ventilation cable 4 and the respective connection chamber 6.

With reference to FIGS. 1 and 2, the ventilation system 1 comprises the electrical ventilation cables 4, the connection chambers 6 and the tubular communication ducts 7 between the connection chambers 6.

Each electrical ventilation cable 4 extends through the body of the insulating element 5 in such a manner as to have an end portion arranged completely within the connection chamber 6, so as to have its micro-ducts 4a in direct communication with the connection chambers 6 and therefore permit the air to circulate from and towards the latter.

More particularly, each electrical ventilation cable 4 is coupled to the insulating element 5 by means of a sealing gasket 8 capable of producing an upper hermetic closure for the connection chamber 6. In the present case, each sealing gasket 8 can be defined by an annular gasket interposed between the end of the respective electrical ventilation cable 4 and an aperture or through-hole 9 produced in the upper part of the insulating element 5.

With regard to the terminals 3 of the electrical circuit 2, on the other hand, said terminals extend from the latter, through the body of the insulating element 5 in such a manner as to project, together with the connection head thereof, within the connection chamber 6 in order to allow connection to the electrical ventilation cable 4.

In particular in FIGS. 1 and 2, each terminal 3 is partly engaged in a tubular section 11 produced in the lower part of the insulating element 5 so as to bring the connection chamber 6 into communication with the electrical circuit 2 and is coupled to said tubular section 11 by means of a comoulded part or sealing gasket 10 capable of producing the lower hermetic seal of the connection chamber 6. In the present case, the sealing gasket 10 is interposed between an intermediate portion of the terminal 3 of the electrical circuit 2 and the tubular section 11 produced in the body of the insulating element 5.

On the basis of the above description, it should be noted that the example shown in FIG. 1 relates to the application of the ventilation system 1 to a first type of electrical wiring arrangement in which the conductive core 4b of the electrical ventilation cable 4 is connected by means of a crimping operation to the coupling head of the terminal 3, which is in turn soldered to the electrical circuit 2.

FIG. 2, in contrast, shows an embodiment of the ventilation system 1 for a second type of electrical wiring arrangement in which each electrical ventilation cable 4 is provided with a connector member 13, which in turn comprises a terminal 14 (male or female), which is crimped to the conductive core 4b of the electrical ventilation cable 4 and is capable of being coupled to the terminal 3 soldered onto the electrical circuit 2.

With reference to FIG. 2, the connector member 13 also comprises an outer tubular portion 15 made of a rigid insulating material accommodating within it the terminal 14 and capable of being coupled with a seat 16 produced in the body of the insulating element 5.

In particular, when engaged in the seat 16, the outer tubular portion 15 of the connector member 13 defines internally, together with said seat, the connection chamber 6, capable of accommodating therein the electrical connection or wiring arrangement between the crimped terminal 14 and the terminal 3 soldered to the electrical circuit 2.

The outer tubular portion 15 of the connector member 13 has an upper closure base 15a, in which there is produced centrally an aperture or through-hole 17, in which the end of the ventilation cable 4 is engaged.

With the aim of ensuring hermetic closure of each connection chamber 6, the connector member 13 is equipped with a sealing gasket 18, for example an annular gasket, which is interposed between the through-hole 17 produced in the base 15a of the tubular portion 15 and the engaged portion of the electrical ventilation cable 4; and a sealing gasket 19, which is interposed between an outer section of the tubular portion 15 and the upper aperture of the seat 16.

With reference to FIG. 2, the tubular duct 7 can be produced in the body of the insulating element 5 in such a manner as to communicate directly with each seat 16 of the connection chambers 6.

On the basis of the above description, it should be noted that the terminals 3 of a single electrical circuit 2 can be wired to the electrical ventilation cables 4 in accordance with both the types of wiring described above; the tubular duct 7 could consequently be produced in the body of the insulating element 5 in such a manner as to bring one or more seats 16 into mutual communication with one or more connection chambers 6 of the connection produced in accordance with the first wiring method.

Figure 3:
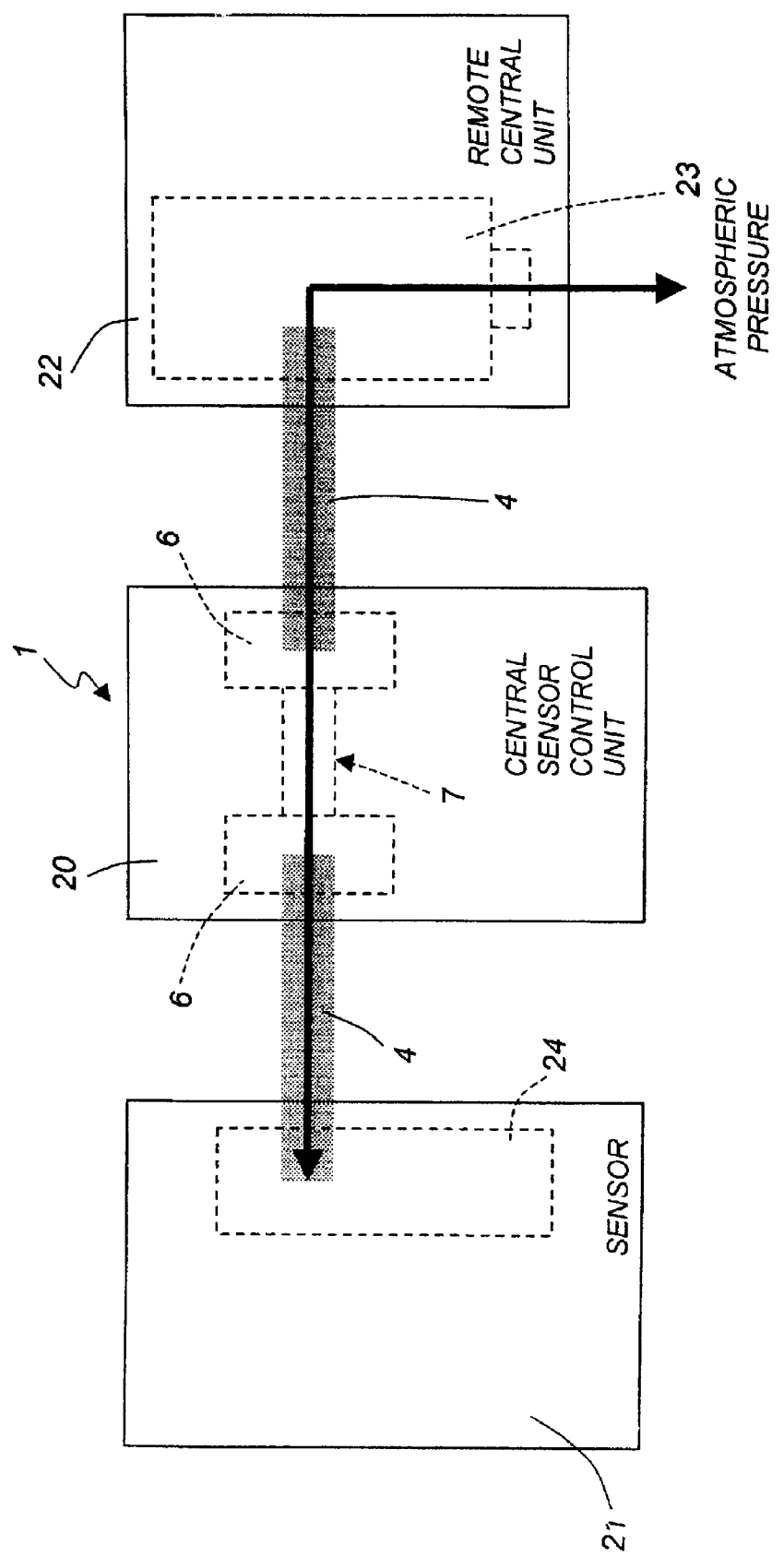
FIG. 3 is a schematic illustration of a possible example of application of the ventilation system for wiring arrangements of electrical circuits, produced as defined by the present invention.

The above-described ventilation system 1 can, for example, advantageously be used for ventilating connection terminals of a central sensor control unit 20 (shown schematically in FIG. 3), the terminals of which can be connected, on the one hand, by means of one or more ventilation cables 4 to one or more sensors 21 and, on the other hand, by means of a ventilation cable 4, to the terminal of a remote central unit 22, which can be accommodated within a chamber 23 that communicates with the outside environment and is thus at atmospheric pressure. The communication ducts 7 present between the inner chambers 6 of the central sensor control unit 20 ensure direct communication between each chamber 24 present in the sensors 21 and the chamber 23 of the remote central unit 22 that communicates with the outside, so ensuring free expansion of the air present within the chambers 24 of each sensor 21 on variation of the temperature to which the sensor 21 is exposed.

The above-described ventilation system 1 thus has the great advantage of being able to ensure circulation of air between all the electrical ventilation cables 4 and all the connection chambers 6 present in the devices so permitting in particular, in the case of sensors provided with a closed inner chamber, free expansion of the air inside the latter, thus avoiding unwanted variations in pressure within the connection chambers 6 or the chambers of the other electrical circuits connected to the ventilation cables 4, for example the hermetically sealed chambers present in the sensors. It should be noted that the above-described ventilation system, by ensuring free air expansion, completely eliminates the possibility of moisture forming within the hermetically sealed chambers present in the sensors.

It should also be emphasised that, in the above-stated ventilation system 1, it is sufficient for the end of any one of the ventilation cables 4 connected to the terminals 3 of the electrical circuit 2 to be located in an environment at atmospheric pressure in order to allow the air present in all the connection chambers to flow freely through the microducts 4a of the electrical ventilation cables 4.

Additionally, the ventilation system 1 is extremely simple and thus economic to produce.

Finally, various modifications and variations may obviously be made to the ventilation system 1 described and illustrated herein without thereby extending beyond the scope of the present invention.

What is claimed is:

1. A ventilation system (1) for electrical wiring arrangements of electrical circuits (2) comprising a plurality of electrical connection terminals (3) arranged within an insulating element (5); said ventilation system (1) being characterized in that it comprises a plurality of electrical ventilation cables (4) connected respectively to said electrical terminals (3) of said electrical circuit (2), a plurality of connection chambers (6) each produced in the body of said insulating element (5) in such a manner as to accommodate therein said connection between said electrical ventilation cable (4) and said terminal (3) while maintaining said connection insulated from the outside; and at least one communication duct (7) between said connection chambers (6) produced in said insulating element (5) and designed so as to permit the passage of air between said connection chambers (6) and through said electrical ventilation cables (4).

2. The ventilation system of claim 1, characterized in that each said terminal (3) is coupled to said insulating element (5) by means of at least one first sealing gasket (10) capable of insulating the connection chamber (6) from the outside.

3. The ventilation system of claim 2, characterized in that said electrical ventilation cable (4) is coupled to said insulating element (5) by means of at least one second sealing gasket (8) capable of producing an upper hermetic closure of the respective connection chamber (6).

4. The ventilation system of claim 2, characterized in that said electrical ventilation cable (4) comprises a connector member (13) capable of being engaged within a seat (16) produced in said insulating element (5); said connector member (13), once coupled with said seat (16), defining within itself said connection chamber (6).

5. The ventilation system of claim 4, characterized in that it comprises at least one third gasket (18) interposed between said connector member (13) and said electrical ventilation cable (4) and capable of producing a hermetic closure of the respective connection chamber (6).

6. The ventilation system of claim 5, characterized in that it comprises at least one fourth gasket (19) interposed between each said connector member (13) and said seat (16) respectively.

7. The ventilation system of claim 4, characterized in that said tubular duct (7) is produced in said insulating element (5) in such a manner as to communicate with at least one said seat (16).

* * * * *

UNITED STATES PATENT AND TRADEMARK OFFICE
CERTIFICATE OF CORRECTION

PATENT NO. : 6,944,021 B2  
DATED : September 13, 2005  
INVENTOR(S) : Michele Cagnoni, Piero Carbonaro and Giuseppe Caudera It is certified that error appears in the above-identified patent and that said Letters Patent is hereby corrected as shown below:

<u>Title page,</u>
Item [75], Inventors, "Turin" should read -- Torino --.

Signed and Sealed this

Twenty-third Day of May, 2006

JON W. DUDAS  
*Director of the United States Patent and Trademark Office*